US012637635B2

(12) United States Patent
Yoshino et al.

(10) Patent No.: US 12,637,635 B2
(45) **Date of Patent: *May 26, 2026**

(54) SURFACE TREATMENT COMPOSITION, METHOD FOR PRODUCING SURFACE TREATMENT COMPOSITION, SURFACE TREATMENT METHOD, AND METHOD FOR PRODUCING SEMICONDUCTOR SUBSTRATE

(71) Applicant: FUJIMI INCORPORATED, Kiyosu (JP)

(72) Inventors: Tsutomu Yoshino, Aichi (JP); Shogo Onishi, Aichi (JP); Yasuto Ishida, Aichi (JP)

(73) Assignee: FUJIMI INCORPORATED, Kiyosu (JP)

(*) Notice: Subject to any disclaimer, the term of this patent is extended or adjusted under 35 U.S.C. 154(b) by 401 days.

This patent is subject to a terminal disclaimer.

(21) Appl. No.: 17/939,645

(22) Filed: Sep. 7, 2022

(65) Prior Publication Data

US 2023/0027432 A1 Jan. 26, 2023

Related U.S. Application Data

(63) Continuation of application No. 17/011,371, filed on Sep. 3, 2020, now Pat. No. 11,466,234.

(30) Foreign Application Priority Data

Sep. 6, 2019 (JP) ................................ 2019-162883
Jun. 26, 2020 (JP) ................................ 2020-110739

(51) Int. Cl.

| | |
|---|---|
| ***C11D 3/37*** | (2006.01) |
| ***B08B 1/12*** | (2024.01) |
| ***B08B 3/08*** | (2006.01) |
| ***C11D 1/00*** | (2006.01) |
| ***H10P 52/40*** | (2026.01) |
| ***H10P 70/00*** | (2026.01) |
| ***H10P 95/00*** | (2026.01) |

(52) U.S. Cl.

CPC .............. *C11D 3/3773* (2013.01); *B08B 1/12* (2024.01); *B08B 3/08* (2013.01); *C11D 1/008* (2013.01); *C11D 3/3707* (2013.01); *H10P 52/403* (2026.01); *H10P 70/237* (2026.01); *H10P 70/277* (2026.01); *H10P 95/062* (2026.01); *C11D 2111/22* (2024.01)

(58) Field of Classification Search

CPC ..... C11D 3/3773; C11D 1/008; C11D 3/3707; C11D 2111/22; C11D 1/22; B08B 1/12; B08B 3/08; B08B 3/12; H01L 21/02065; H01L 21/02074; H01L 21/31053; H01L 21/3212; H01L 21/02057

USPC .......................................................... 438/692

See application file for complete search history.

(56) References Cited

U.S. PATENT DOCUMENTS

| | | | | |
|---|---|---|---|---|
| 11,162,057 | B2 | 11/2021 | Yoshino et al. | |
| 2005/0284844 | A1 | 12/2005 | Hattori et al. | |
| 2006/0128581 | A1* | 6/2006 | Sawada ................ | C11D 7/3281 430/311 |
| 2013/0174867 | A1 | 7/2013 | Harada et al. | |
| 2018/0188654 | A1* | 7/2018 | Rowell ..................... | G03F 7/40 |
| 2018/0195030 | A1* | 7/2018 | Sakanishi ............... | G03F 7/425 |
| 2018/0254223 | A1* | 9/2018 | Hirata .................. | B23K 26/082 |
| 2019/0093056 | A1 | 3/2019 | Yoshino et al. | |
| 2019/0256805 | A1 | 8/2019 | Goto et al. | |
| 2021/0284930 | A1 | 9/2021 | Hirano et al. | |

FOREIGN PATENT DOCUMENTS

| | | | | |
|---|---|---|---|---|
| CN | 109716488 | * | 5/2019 | ............... C09G 1/02 |
| JP | 2012-074678 | A | 4/2012 | |
| JP | 2016-056220 | A | 4/2016 | |
| JP | 2017-107905 | A | 6/2017 | |
| JP | 2019-062174 | A | 4/2019 | |
| KR | 20140074966 | * | 6/2014 | |
| RU | 2577281 | C2 * | 3/2016 | ............... C09G 1/02 |

(Continued)

OTHER PUBLICATIONS

Ruixibiotech, Poly(N-vinyl acetamide) (Year: 2024).*

(Continued)

*Primary Examiner* — Duy Vu N Deo

(74) *Attorney, Agent, or Firm* — Foley & Lardner LLP

(57) ABSTRACT

To provide a means capable of sufficiently removing organic residues present on the surface of a polishing object after polishing containing silicon oxide or polysilicon.

A surface treatment composition contains a polymer having a constituent unit represented by Formula (1) below and water and is used for treating the surface of a polishing object after polishing, (1)

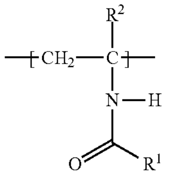

in which, in Formula (1) above, $R^1$ is a hydrocarbon group having 1 to 5 carbon atoms and $R^2$ is a hydrogen atom or a hydrocarbon group having 1 to 3 carbon atoms.

15 Claims, No Drawings

(56) References Cited

FOREIGN PATENT DOCUMENTS

| | | | |
|---|---|---|---|
| WO | WO-2016/035346 | A1 | 3/2016 |
| WO | WO-2018/062053 | A1 | 4/2018 |

OTHER PUBLICATIONS

U.S. Notice of Allowance on U.S. Appl. No. 17/011,371 dated Jun. 8, 2022.
U.S. Office Action on U.S. Appl. No. 17/011,371 dated Dec. 9, 2021.
SG Search Report with written opinion on SG Appl. Ser. No. 10202008582V dated Jun. 6, 2023 (10 pages).

* cited by examiner

SURFACE TREATMENT COMPOSITION, METHOD FOR PRODUCING SURFACE TREATMENT COMPOSITION, SURFACE TREATMENT METHOD, AND METHOD FOR PRODUCING SEMICONDUCTOR SUBSTRATE

CROSS-REFERENCE TO RELATED APPLICATIONS

This application is a continuation application of U.S. patent application Ser. No. 17/011,371, filed on Sep. 3, 2020, which claims priority to Japanese Patent Application No. 2020-110739, filed on Jun. 26, 2020, and claims priority to Japanese Patent Application No. 2019-162883, filed on Sep. 6, 2019, the entire disclosures of which are incorporated herein by reference.

BACKGROUND OF THE INVENTION

Field of the Invention

The present invention relates to a surface treatment composition, a method for producing a surface treatment composition, a surface treatment method, and a method for producing a semiconductor substrate.

Description of the Related Art

In recent years, with multilayer-wiring on the surface of a semiconductor substrate, a so-called chemical mechanical polishing (CMP) art of polishing the semiconductor substrate for planarization has been utilized in manufacturing a semiconductor device. The CMP is a method for planarizing the surface of a polishing object (object to be polished), such as a semiconductor substrate, using a polishing composition (slurry) containing abrasives, such as silica, alumina, and ceria, anticorrosives, surfactants, and the like. Examples of the polishing object (object to be polished) include silicon, polysilicon, a silicon oxide film (silicon oxide), silicon nitride, wiring lines containing a metal and the like, a plug, and the like.

On the semiconductor substrate surface after a CMP step, a large amount of impurities (defects) remain. Examples of the impurities include organic matter, such as abrasives, metals, anticorrosives, and surfactants derived from a polishing composition used in the CMP, silicon containing materials and metals generated by polishing silicon containing materials, metal wiring lines, plugs, and the like which are polishing objects, and further organic matter, such as pad debris generated from various pads, for example.

When the semiconductor substrate surface is contaminated with these impurities, the electrical characteristics of the semiconductor are adversely affected, so that there is a possibility that the reliability of the semiconductor device decreases. Therefore, it is desirable to introduce a cleaning step after the CMP step to remove these impurities from the semiconductor substrate surface.

As a cleaning liquid (cleaning composition) used for such a cleaning step, one disclosed in PTL 1 is mentioned, for example. PTL 1 discloses a slurry composition for chemical mechanical polishing containing water, polishing abrasives, and one or more types of water-soluble polymers containing a polyvinyl alcohol structural unit.

CITATION LIST

Patent Literature

PTL 1: JP 2012-74678 A

SUMMARY OF THE INVENTION

In cleaning of a polishing object after polishing, a further defect reduction has been desired.

Herein, the present inventors have examined the relationship between the type of the polishing object after polishing and the type of the defects. As a result, the present inventors have found that organic residues are likely to remain on the surface of the polishing object after polishing (for example, semiconductor substrate after polishing) containing silicon nitride, silicon oxide, or polysilicon and such organic residues may cause destruction of the semiconductor device.

The present invention has been made in view of the above-described problems. It is an object of the present invention to provide a means capable of sufficiently removing organic residues present on the surface of a polishing object after polishing containing silicon oxide or polysilicon.

The present inventors have extensively advanced an examination in view of the above-described problems. As a result, the present inventors have found that organic residues present on the surface of a polishing object after polishing containing silicon oxide or polysilicon can be sufficiently removed by the use of a surface treatment composition containing a polymer having a constituent unit represented by Formula (1) below and water, and thus has accomplished the present invention.

(1)

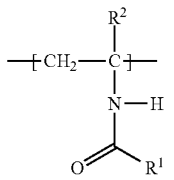

In Formula (1) above, $R^1$ is a hydrocarbon group having 1 to 5 carbon atoms and $R^2$ is a hydrogen atom or a hydrocarbon group having 1 to 3 carbon atoms.

The present invention provides a means capable of sufficiently removing organic residues present on the surface of a polishing object after polishing containing silicon oxide or polysilicon.

DESCRIPTION OF THE PREFERRED EMBODIMENTS

Hereinafter, the present invention is described. The present invention is not limited only to the following embodiment.

In this specification, in the specific names of compounds, the indication "(meth)acryl" refers to "acryl" and "methacryl" and the indication "(meth)acrylate" refers to "acrylate" and "methacrylate".

[Organic Residues]

In this specification, organic residues indicate components containing organic matter, such as organic low molecular weight compounds and high molecular weight compounds, organic salts, and the like among contaminants adhering to the surface of a polishing object after polishing.

Examples of the organic residues adhering to a cleaning object include pad debris generated from a pad used in a polishing step or a rinse polishing step which may be optionally provided described later, components derived from additives contained in a polishing composition used in the polishing step or a rinse polishing composition used in the rinse polishing step, and the like, for example.

The organic residues and the other contaminants are greatly different in color and shape. Therefore, it can be visually determined by SEM observation whether the contaminants are the organic residues. As necessary, the determination may also be performed by ultimate analysis by means of energy dispersive X-ray spectroscopy (EDX).

[Polishing Object after Polishing]

In this specification, the polishing object after polishing means a polishing object after being polished in the polishing step. The polishing step is not particularly limited and is preferably a CMP step.

A surface treatment composition according to one aspect of the present invention is preferably used for reducing the organic residues remaining on the surface of a polishing object after polishing (hereinafter also simply referred to as "cleaning object") containing silicon nitride (hereinafter also simply referred to as "SiN"), silicon oxide, or polysilicon (hereinafter also simply referred to as "Poly-Si"). Examples of the polishing object after polishing containing silicon oxide include, for example, a TEOS type silicon oxide surface (hereinafter also simply referred to as "TEOS") generated using tetraethyl orthosilicicate as a precursor, an HDP film, a USG film, a PSG film, a BPSG film, an RTO film, and the like.

The polishing object after polishing is preferably a semiconductor substrate after polishing and is more preferably a semiconductor substrate after the CMP. This is because particularly the organic residues may cause destruction of a semiconductor device, and therefore, when the polishing object after polishing is a semiconductor substrate after polishing, a cleaning step of the semiconductor substrate is required to be a step capable of removing the organic residues as much as possible.

Examples of the polishing object after polishing containing silicon nitride, silicon oxide, or polysilicon include, but are not particularly limited to, a polishing object after polishing containing a silicon nitride simple substance, a silicon oxide simple substance, and a polysilicon simple substance, a polishing object after polishing in a state in which materials other than silicon nitride, silicon oxide, and polysilicon are exposed to the surface in addition to silicon nitride, silicon oxide, or polysilicon, and the like. Herein, examples of the former include, for example, a silicon nitride substrate, a silicon oxide substrate, or a polysilicon substrate which is a conductor substrate. As the latter, the materials other than silicon nitride, silicon oxide, or polysilicon are not particularly limited and tungsten and the like are mentioned, for example. Specific examples of such polishing object after polishing include a semiconductor substrate after polishing having a structure in which a silicon nitride film, a silicon oxide film, or a polysilicon film is formed on tungsten, a semiconductor substrate after polishing having a structure in which a tungsten portion, a silicon nitride film, a silicon oxide film, and a polysilicon film are all exposed, and the like.

Herein, the polishing object after polishing according to one aspect of the present invention preferably contains polysilicon from the viewpoint of the effects exhibited by the present invention.

[Surface Treatment Composition]

One aspect of the present invention is a surface treatment composition containing a polymer having a constituent unit represented by Formula (1) below and water, and used for treating the surface of the polishing object after polishing.

(1)

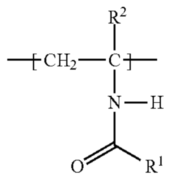

In Formula (1) above, $R^1$ is a hydrocarbon group having 1 to 5 carbon atoms and $R^2$ is a hydrogen atom or a hydrocarbon group having 1 to 3 carbon atoms.

The surface treatment composition according to one aspect of the present invention is particularly preferably used as an organic residue reduction agent for selectively removing the organic residue in a surface treatment step.

The present inventors estimate a mechanism that the above-described problems are solved by the present invention as follows. The surface treatment composition has a function of removing the contaminants on the surface of the polishing object after polishing or facilitating the removal as a result of a chemical interaction between each component contained in the surface treatment composition, and the surface of the polishing object after polishing and the contaminants.

The polymer having the constituent unit represented by Formula (1) can change a hydrophobic wafer surface to a hydrophilic wafer surface by physically adsorbing to the hydrophobic wafer surface. The organic residues adhering onto the wafer temporarily float during treatment, and thereafter the polymer adsorbs to the wafer. As a result, a layer formed of the polymer functions as a re-adhesion prevention layer of the organic residues, and thus the organic residues can be easily removed from the wafer.

The above-described mechanism is based on a presumption, and thus correction or incorrection thereof does not affect the technical scope of the present invention.

Hereinafter, each component contained in the surface treatment composition is described.

[Polymer Having Constituent Unit Represented by Formula (1)]

As the hydrocarbon group having 1 to 5 carbon atoms represented by $R^1$ in Formula (1) above, alkyl groups, such as a methyl group, an ethyl group, and a propyl group; alkenyl groups, such as an ethenyl group and a propenyl group; alkynyl groups, such as an ethynyl group and a propynyl group, cycloalkyl groups, such as a cyclopentyl group; and the like can be mentioned. Among the above, the alkyl groups and the alkynyl groups are preferable and hydrocarbon groups having 1 to 3 carbon atoms are also preferable. As $R^1$, the methyl group, the ethyl group, and the ethenyl group (vinyl group) are more preferable and the methyl group and the ethyl group are still more preferable.

As the hydrocarbon groups having 1 to 3 carbon atoms represented by $R^2$ in Formula (1) above, those having 1 to 3 carbon atoms among those illustrated as the hydrocarbon groups having 1 to 5 carbon atoms represented by $R^1$ can be mentioned. As $R^2$, a hydrogen atom and a methyl group are preferable.

As unsaturated monomers giving the above-described constituent units, N-vinylacetamide, N-vinylpropionamide, N-vinylbutylamide, and the like can be mentioned and the N-vinylacetamide and the N-vinylpropionamide are preferable. The unsaturated monomers above can be used alone or as a mixture of two or more types thereof.

The weight average molecular weight (Mw) of the polymer is usually 30,000 or more and 1,000,000 or less, preferably 50,000 or more and 900,000 or less, and more preferably 50,000 or more and 100,000 or less. By setting the weight average molecular weight (Mw) of the polymer within the range above, the organic residues on the surface of the polishing object after polishing can be more effectively reduced.

The lower limit of the content (total amount in a case of two or more types) of the polymer having the constituent unit represented by Formula (1) is not particularly limited and is preferably 0.02 mass % or more based on the total amount of the surface treatment composition. When the content is 0.02 mass % or more, the organic residues on the surface of the polishing object after polishing can be more effectively reduced.

From a similar viewpoint, a lower limit value of the content of the polymer having the constituent unit represented by Formula (1) is more preferably 0.03 mass % or more and still more preferably 0.05 mass % or more based on the total amount of the surface treatment composition. On the other hand, an upper limit value of the content of the polymer having the constituent unit represented by Formula (1) is preferably 1 mass % or less based on the total amount of the surface treatment composition. When the content is 1 mass % or less, the removal of the polymer having the constituent unit represented by Formula (1) itself after surface treatment is facilitated. From a similar viewpoint, the upper limit value of the content of the polymer having the constituent unit represented by Formula (1) is more preferably 0.7 mass % or less and still more preferably 0.5 mass % or less based on the total amount of the surface treatment composition.

The content of the constituent unit in the polymer is preferably 30 mol % or more and 100 mol % or less, more preferably 50 mol % or more and 100 mol % or less, and still more preferably 70 mol % or more and 100 mol % or less. By setting the content of the constituent unit within the range above, the organic residues on the surface of the polishing object after polishing can be more effectively reduced.

[Water-Soluble Polymer Having Constituent Unit Derived from Glycerol]

The surface treatment composition according to one aspect of the present invention may also contain a water-soluble polymer having a constituent unit derived from glycerol.

Preferable examples of the water-soluble polymer having the constituent unit derived from glycerol include at least one type selected from the group consisting of polyglycerol (see Formula (2) below), alkyl (C10 to 14) ester of polyglycerol, polyglycerol alkyl (C10 to 14) ether, ethylene oxide-modified polyglycerol, sulfonic acid-modified polyglycerol (for example, see Formulae (3) and (4) below), and phosphonic acid-modified polyglycerol (for example, see Formulae (5) and (6) below).

[Chem. 3]

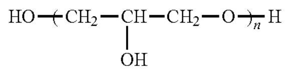
(2)

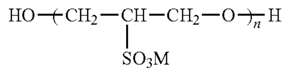
(3)

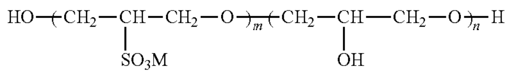
(4)

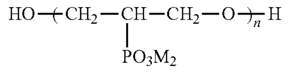
(5)

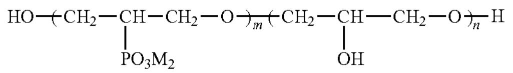
(6)

m and n in Formulae (2) to (6) above each independently represent the number of repeating units. M in Formulae (3) to (6) above each independently represent a hydrogen atom, Na, K, or $NH_4^+$.

A plurality of Ms in Formulae (3) to (6) above may be the same or may be different from each other. For example, n pieces of Ms in Formula (3) above may be all Na or may be a combination of two or more types of a hydrogen atom, Na, K, and $NH_4^+$. For example, m pieces of Ms in Formula (4) above may be all Na or may be a combination of two or more types of a hydrogen atom, Na, K, and $NH_4^+$.

The water-soluble polymers having the constituent unit derived from glycerol can be used alone or in combination of two or more types thereof.

The content (concentration) (total amount in a case of two or more types) of the water-soluble polymer having the constituent unit derived from glycerol is not particularly limited and is preferably 0.02 mass % or more based on the total amount of the surface treatment composition. When the content of the water-soluble polymer having the constituent unit derived from glycerol is 0.02 mass % or more, the effects of the present invention are improved.

From a similar viewpoint, the content (concentration) of the water-soluble polymer having the constituent unit derived from glycerol is more preferably 0.03 mass % or more and still more preferably 0.05 mass % or more based on the total amount of the surface treatment composition. The content (concentration) of the water-soluble polymer having the constituent unit derived from glycerol is preferably 1 mass % or less based on the total amount of the surface treatment composition. When the content (concentration) of the water-soluble polymer having the constituent unit derived from glycerol is 1 mass % or less, the removal of the water-soluble polymer having the constituent unit derived from glycerol itself after surface treatment is facilitated. From a similar viewpoint, the content (concentration) of the water-soluble polymer having the constituent unit derived from glycerol is more preferably 0.7 mass % or less and still more preferably 0.5 mass % or less based on the total amount of the surface treatment composition.

The weight average molecular weight (Mw) of the water-soluble polymer having the constituent unit derived from glycerol is preferably 1,000 or more. When the weight average molecular weight is 1,000 or more, the contaminant removal effect is further improved. This is presumed to be because the covering property when the water-soluble polymer having the constituent unit derived from glycerol covers the cleaning object or the contaminants is further improved, so that a removal action of the contaminants from the cleaning object surface or a re-adhesion suppressing action of the contaminants to the cleaning object surface is further improved. From a similar viewpoint, the weight average molecular weight is more preferably 3,000 or more and still more preferably 8,000 or more. An upper limit value of the weight average molecular weight of the water-soluble polymer having the constituent unit derived from glycerol is not particularly limited and is preferably 1,000,000 or less, more preferably 100,000 or less, and still more preferably 50,000 or less. The weight average molecular weight can be determined in terms of polyethylene glycol using a GPC apparatus (manufactured by Shimadzu Corporation, Model type: Prominence+ELSD detector (ELSD-LTII)) or the like by gel permeation chromatography (GPC) and specifically can be measured by a method described in Examples.

As the water-soluble polymer having the constituent unit derived from glycerol, commercially-available items may be used or synthetic products may be used. A production method in a case of performing synthesis is not particularly limited and known polymerization methods are usable.

[Acid]

The surface treatment composition according to one aspect of the present invention may also contain acids. In this specification, an ionic dispersant described below is dealt with as an acid different from acids as additives described herein. The acids are added for the purpose of mainly adjusting the pH of the surface treatment composition.

It is presumed that the acids play a role of charging the surface of the polishing object after polishing or the contaminant surfaces with positive charges when the polishing object after polishing contains silicon nitride, silicon oxide, or polysilicon. Therefore, when the surface treatment composition is used to contaminants or a cleaning object having a property capable of positively charging the surface treatment composition, an electrostatic repulsion effect is further promoted by adding the acids, so that the contaminant removal effect by the surface treatment composition is further improved.

As the acids, either inorganic acids or organic acids may be used. Examples of the inorganic acids include, but are not particularly limited to, sulfuric acid, nitric acid, boric acid, carbonic acid, hypophosphorous acid, phosphorous acid, phosphoric acid, and the like, for example. Examples of the organic acids include, but are not particularly limited to, carboxylic acids, such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, methanesulfonic acid, ethanesulfonic acid, isethionic acid, and the like.

Among the above, maleic acid or nitric acid is more preferable from the viewpoint that an effect of charging the surface of the polishing object after polishing or the contaminant surfaces with positive charges is further improved and the removability of the contaminants is increased.

The acids can be used alone or in combination of two or more types thereof.

The content of the acids is preferably 0.01 mass % or more based on the total amount of the surface treatment composition. When the content of the acids is 0.01 mass % or more, the contaminant removal effect is further improved. This is presumed to be because the effect of charging the surface of the polishing object after polishing or the contaminant surfaces with positive charges is further improved. From a similar viewpoint, the content of the acids is preferably 0.02 mass % or more and more preferably 0.03 mass % or more based on the total amount of the surface treatment composition. The content of the acids is preferably 5 mass % or less based on the total amount of the surface treatment composition. The content is preferable from the viewpoint that the cost is reduced when the content of the acids is 5 mass % or less. From a similar viewpoint, the content of the acids is more preferably 3 mass % or less and still more preferably 1 mass % or less based on the total amount of the surface treatment composition.

[Dispersion Medium]

The surface treatment composition according to one aspect of the present invention essentially contains water as a dispersion medium (solvent). The dispersion medium has a function of dispersing or dissolving each component. The dispersion medium is more preferably only water. Alternatively, the dispersion medium may be a mixed solvent of water and organic solvents for the dispersion or the dissolution of each component. In this case, examples of the organic solvents to be used include acetone, acetonitrile, ethanol, methanol, isopropanol, glycerol, ethylene glycol, propylene glycol, and the like which are organic solvents mixed with water. Alternatively, these organic solvents may be used without being mixed with water and may be mixed with water after dispersing or dissolving each component. These organic solvents can be used alone or in combination of two or more types thereof.

Water is preferably water free from impurities as much as possible from the viewpoint of contamination of the cleaning object or blocking of actions of other components. For example, water having a total content of transition metal ions of 100 ppb or less is preferable. Herein, the purity of water can be increased by an operation, such as the removal of impurity ions using an ion-exchange resin, the removal of contaminants with a filter, or distillation, for example. Specifically, as water, deionized water (ion exchange water), pure water, ultrapure water, distilled water, and the like are preferably used, for example.

[pH]

The pH of the surface treatment composition according to one aspect of the present invention may exceed 5 but is preferably 5 or less. In the case where the pH is 5 or less, when the surface treatment composition is used for the contaminants or the cleaning object having a property capable of positively charging the surface treatment composition, the cleaning object surface or the contaminant surfaces can be more certainly charged with positive charges and a higher contaminant removal effect can be obtained by electrostatic repulsion. When the pH exceeds 5, the contaminant removal effect is hard to obtain under specific conditions (for example, silicon nitride substrate after polishing as illustrated in Example 10 described later). The pH is more preferably 4 or less, still more preferably 3 or less, and yet still more preferably less than 3 (for example, 2.5). The pH of the surface treatment composition is preferably 1 or more. When the pH is 1 or more, the cost can be further reduced.

A pH value of the surface treatment composition can be confirmed with a pH meter (manufactured by HORIBA, LTD., Product Name: LAQUA (Registered Trademark)).

When adjusting the pH value, components other than the surface treatment composition according to one aspect of the present invention may serve as a cause of contaminants, and therefore are not preferably added as much as possible. Therefore, the surface treatment composition is preferably prepared only from the water-soluble polymer having the constituent unit derived from glycerol, acids, water, and the ionic dispersants added as necessary. However, when it is difficult to obtain a desired pH only by these substances, the pH may be adjusted using other additives, such as alkali, which may be optionally added within the range where the effects of the present invention are not impaired.

[Ionic Dispersant]

The surface treatment composition according to one aspect of the present invention preferably further contains the ionic dispersant. The ionic dispersant contributes to the removal of the contaminants by the surface treatment composition. Hence, the surface treatment composition containing the ionic dispersant can sufficiently remove the contaminants (impurities including the organic residues and the like) remaining on the surface of the polishing object after polishing in the surface treatment (cleaning or the like) of the polishing object after polishing.

Examples of the ionic dispersant include high molecular weight compounds having a sulfonic acid (salt) group; high molecular weight compounds having a phosphoric acid (salt) group; high molecular weight compounds having a phosphonic acid (salt) group; high molecular weight compounds having a carboxylic acid (salt) group; water-soluble polymers containing nitrogen atoms, such as polyvinyl pyrrolidone (PVP), polyvinyl imidazole (PVI), polyvinyl carbazole, polyvinyl caprolactam, polyvinyl piperidine, and polyacryloyl morpholine (PACMO); polyvinyl alcohol (PVA); hydroxyethylcellulose (HEC); and the like.

Among the above, the high molecular weight compounds having a sulfonic acid (salt) group are preferable. Hereinafter, the high molecular weight compounds having a sulfonic acid (salt) group are described.

<High Molecular Weight Compounds Having Sulfonic Acid (Salt) Group>

It is preferable in the surface treatment composition according to one aspect of the present invention that the ionic dispersant is the high molecular weight compound having a sulfonic acid (salt) group. The high molecular weight compound having a sulfonic acid (salt) group (hereinafter also simply referred to as "sulfonic acid group-containing polymer" in this specification) is likely to contribute to the removal of the contaminants by the surface treatment composition. Hence, the surface treatment composition containing the sulfonic acid group-containing polymer described above has an effect that the contaminants (impurities including the organic residues and the like) remaining on the surface of the polishing object after polishing are more easily removed in the surface treatment (cleaning or the like) of the polishing object after polishing.

The sulfonic acid group-containing polymer can form micelles due to affinity between a portion other than the sulfonic acid (salt) group (i.e., polymer chain portion of the sulfonic acid group-containing polymer) and the contaminants (particularly hydrophobic components). Hence, it is considered that, due to the micelles being dissolved or dispersed in the surface treatment composition, the contaminants which are the hydrophobic components are also effectively removed.

Under an acidic condition, when the surface of the polishing object after polishing is cationic, the sulfonic acid group-containing polymer is likely to adsorb to the surface of the polishing object after polishing by the anionizing of the sulfonic acid group. As a result, it is considered that the sulfonic acid group-containing polymer covers the surface of the polishing object after polishing. On the other hand, the sulfonic acid group of the sulfonic acid group-containing polymer is likely to adsorb to the remaining contaminants (particularly those which are easily cationized), and therefore the contaminant surfaces are anionized. Hence, the contaminants having surfaces which have become anionic and the anionized sulfonic acid group of the sulfonic acid group-containing polymer adsorbing to the surface of the polishing object after polishing electrostatically repulse each other. When the contaminants are anionic, the contaminants themselves and the anionized sulfonic acid group present on the polishing object after polishing electrostatically repulse each other. Therefore, it is considered that the contaminants can be effectively removed by utilizing such electrostatic repulsion.

Furthermore, when the polishing object after polishing is hard to be charged, it is presumed that the contaminants are removed by a mechanism different from the mechanism described above. First, it is considered that the contaminants (particularly hydrophobic components) are in a state of being likely to adhere to the polishing object after polishing which is hydrophobic by a hydrophobic interaction. Herein, the polymer chain portion (hydrophobic structure part) of the sulfonic acid group-containing polymer is directed to the surface side of the polishing object after polishing due to the hydrophobicity thereof. Whereas, the anionized sulfonic acid group and the like which are hydrophilic structural parts are directed to the side opposite to the surface side of the polishing object after polishing. Thus, it is presumed that the surface of the polishing object after polishing is covered with the anionized sulfonic acid group to become hydrophilic. As a result, it is considered that the hydrophobic interaction is hard to occur between the contaminants (particularly hydrophobic components) and the polishing object after polishing, and thus the adhesion of the contaminants is suppressed.

Then, the polymer having the constituent unit represented by Formula (1) above adsorbing to the surface of the polishing object after polishing, the water-soluble polymer having the constituent unit derived from glycerol, and the sulfonic acid group-containing polymer are easily removed by further performing water cleaning or the like.

In this specification, the "sulfonic acid (salt) group" indicates a sulfonic acid group ($—SO_3H$) or a salt group thereof ($—SO_3M^2$; herein, $M^2$ is an organic or inorganic cation).

The sulfonic acid group-containing polymer is not particularly limited insofar as it has a plurality of sulfonic acid (salt) groups and known compounds are usable. Examples of the sulfonic acid group-containing polymer include high molecular weight compounds obtained by sulfonating a high molecular weight compound serving as a base, high molecular weight compounds obtained by (co)polymerizing a monomer having a sulfonic acid (salt) group, and the like.

More specifically, sulfonic acid (salt) group-containing polystyrenes, such as sulfonic acid (salt) group-containing polyvinyl alcohols (sulfonic acid-modified polyvinyl alcohols), polystyrene sulfonate, and sodium polystyrene sulfonate, sulfonic acid (salt) group-containing polyvinyl acetates (sulfonic acid-modified polyvinyl acetates), sulfonic acid (salt) group-containing polyesters, copolymers of (meth)acrylic group-containing monomer-sulfonic acid (salt) group-containing monomer, such as copolymers of (meth)acrylic acid-sulfonic acid (salt) group-containing monomer, and the like are mentioned. In this specification, in the specific names of compounds, the indication "(meth) acryl" refers to "acryl" and "methacryl" and the indication "(meth)acrylate" refers to "acrylate" and "methacrylate". The above-described sulfonic acid group-containing polymers can be used alone or in combination of two or more types thereof. At least one part of the sulfonic acid group possessed by the polymers may have a form of a salt. Examples of the salts include alkali metal salts, such as sodium salts and potassium salts, salts of Group II elements, such as calcium salts and magnesium salts, amine salts, ammonium salts, and the like. In particular, when the polishing object after polishing is a semiconductor substrate after the CMP step, ammonium salts are preferable from the viewpoint of removing metals on the substrate surface as much as possible.

When the sulfonic acid group-containing polymer is sulfonic acid group-containing polyvinyl alcohol, the degree of saponification is preferably 80% or more and more preferably 85% or more (upper limit of 100%) from the viewpoint of solubility.

In the present invention, the weight average molecular weight of the sulfonic acid group-containing polymer is preferably 1,000 or more. When the weight average molecular weight is 1,000 or more, the contaminant removal effect is further increased. This is presumed to be because the covering property in covering the polishing object after polishing or the contaminants is further improved, so that the removal action of the contaminants from the cleaning object surface or the re-adhesion suppressing action of the organic residues to the surface of the polishing object after polishing is further improved. From a similar viewpoint, the weight average molecular weight is more preferably 2,000 or more and still more preferably 8,000 or more.

The weight average molecular weight of the sulfonic acid group-containing polymer is preferably 100,000 or less. When the weight average molecular weight is 100,000 or less, the contaminant removal effect is further increased. This is presumed to be because the removability of the sulfonic acid group-containing polymer after the cleaning step is further improved. From a similar viewpoint, the weight average molecular weight is more preferably 50,000 or less and still more preferably 40,000 or less.

The weight average molecular weight can be measured by gel permeation chromatography (GPC) and specifically can be measured by a method described in Examples.

As the sulfonic acid group-containing polymer, commercially-available items may be used, and for example, GOHSENX (Registered Trademark) L-3226 and GOHSENX (Registered Trademark) CKS-50 manufactured by Nippon Synthetic Chemical Industry Co., Ltd., Aron (Registered Trademark) A-6012, A-6016A, and A-6020 manufactured by Toagosei Co., Ltd., PolyNaSS (Registered Trademark) PS-1 manufactured by Tosoh Organic Chemical Co., Ltd., and the like are usable.

The content (concentration) of the sulfonic acid group-containing polymer is preferably 0.001 mass % or more based on the total amount of the surface treatment composition. When the content of the sulfonic acid group-containing polymer is 0.001 mass % or more, the contaminant removal effect is further improved. This is presumed to be because, when the sulfonic acid group-containing polymer covers the polishing object after polishing and the contaminants, the polishing object after polishing and the contaminants are covered in larger areas. Thus, particularly the contaminants easily form micelles, and therefore the contaminant removal effect by the dissolution/dispersion of the micelles is improved. Moreover, it is presumed to be because the electrostatic adsorption or the repulsion effect can be more strongly revealed due to an increase in the number of the sulfonic acid (salt) groups. From a similar viewpoint, the content (concentration) of the sulfonic acid group-containing polymer is more preferably 0.003 mass % or more and still more preferably 0.005 mass % or more based on the total amount of the surface treatment composition. The content (concentration) of the sulfonic acid group-containing polymer is preferably 0.5 mass % or less based on the total amount of the surface treatment composition. When the content (concentration) of the sulfonic acid group-containing polymer is 0.5 mass % or less, the contaminant removal effect is further increased. This is presumed to be because the removability of the sulfonic acid group-containing polymer itself after the cleaning step is improved. From a similar viewpoint, the content of the sulfonic acid group-containing polymer is more preferably 0.2 mass % or less, still more preferably 0.1 mass % or less, and particularly preferably 0.05 mass % or less based on the total amount of the surface treatment composition.

In this specification, the "high molecular weight compound" refers to a compound having a weight average molecular weight of 1,000 or more.

[Other Additives]

The surface treatment composition according to one aspect of the present invention may further contain other additives in any proportion as necessary within the range where the effects of the present invention are not impaired. However, components other than the essential components of the surface treatment composition according to one aspect of the present invention may be a cause of the contaminants, and thus the addition is desirably minimized. Thus, it is preferable that the components other than the essential components are added in as small amounts as possible and it is more preferable that such components are not contained. Examples of other additives include, for example, abrasives, alkali, antiseptic agents, dissolved gases, reducing agents, oxidants, alkanolamines, and the like. Among the above, the surface treatment composition is preferably substantially free from abrasives for a further improvement of the contaminant removal effect. Herein, the description "substantially free from abrasives" refers to a case where the content of the abrasives based on the entire surface treatment composition is 0.01 mass % or less.

As the number of the contaminants (organic residues), a value measured by a method described in Examples after performing the surface treatment by a method described in Examples is adopted.

[Method for Producing Surface Treatment Composition]

A method for producing the above-described surface treatment composition is not particularly limited. For example, the surface treatment composition can be produced by mixing the polymer having the constituent unit represented by Formula (1) above and water. More specifically, another aspect of the present invention further provides a method for producing the above-described surface treatment composition including mixing the polymer having the constituent unit represented by Formula (1) above and water. The types, the addition amounts, and the like of the polymer having the constituent unit represented by Formula (1) above are as described above. Furthermore, in the method for producing the surface treatment composition according to one aspect of the present invention, the ionic dispersant, the water-soluble polymer having the constituent unit derived from glycerol (glycerol-based water-soluble polymer), other additives, dispersion media other than water, and the like may be further mixed as necessary. The types, the addition amounts, and the like thereof are as described above.

The order of addition and methods of addition of the components above are not particularly limited. The materials above may be added at once or separately or in stages or continuously. Moreover, mixing methods are also not particularly limited and known methods are usable. Preferably, the method for producing the above-described surface treatment composition includes successively adding the water-soluble polymer having the constituent unit derived from glycerol, acids, water, and the ionic dispersant added as necessary, followed by stirring in water. In addition thereto, the method for producing the above-described surface treatment composition may further include measuring the pH of the surface treatment composition, and then adjusting the pH to 5 or less.

[Surface Treatment Method]

Another aspect of the present invention is a surface treatment method including surface-treating the polishing object after polishing using the above-described surface treatment composition. In this specification, the surface treatment method refers to a method including reducing the contaminants on the surface of the polishing object after polishing and is a method including performing cleaning in a broad sense.

The surface treatment method according to one aspect of the present invention can sufficiently remove the contaminants remaining on the surface of a polishing object after polishing. More specifically, another aspect of the present invention provides a method for reducing the contaminants on the surface of the polishing object after polishing including surface-treating the polishing object after polishing using the above-described surface treatment composition.

The surface treatment method according to one aspect of the present invention is performed by a method including bringing the surface treatment composition according to the present invention into direct contact with the polishing object after polishing.

Examples of the surface treatment method mainly include (I) a method by rinse polishing treatment and (II) a method by cleaning treatment. More specifically, the surface treatment according to one aspect of the present invention is preferably performed by rinse polishing or cleaning. The rinse polishing treatment and the cleaning treatment are carried out to remove the contaminants (particles, metal contamination, organic residues, pad debris, and the like) on the surface of the polishing object after polishing, thereby obtaining a clean surface. The above methods (I) and (II) are described below.

(I) Rinse Polishing Treatment

The surface treatment composition according to the present invention is suitably used in the rinse polishing treatment. The rinse polishing treatment is performed on a polishing platen to which a polishing pad is attached for the purpose of removing the contaminants on the surface of the polishing object after the polishing object has been subjected to final polishing. At this time, the rinse polishing treatment is performed by bringing the surface treatment composition according to the present invention into direct contact with the polishing object after polishing. As a result, the contaminants on the surface of the polishing object after polishing are removed by frictional force (physical action) by the polishing pad and chemical action by the surface treatment composition. Among the contaminants, particularly the particles and the organic residues are easily removed by the physical action. Therefore, in the rinse polishing treatment, the particles and the organic residues can be effectively removed by utilizing the friction with the polishing pad on the polishing platen.

Specifically, the rinse polishing treatment can be performed by installing the surface of the polishing object after polishing after the polishing step on the polishing platen of a polishing device to bring the polishing pad and the semiconductor substrate after polishing into contact with each other, and then causing the polishing object after polishing and the polishing pad to slide relative to each other while supplying the surface treatment composition (rinse polishing composition) to a contact region of the polishing pad and the semiconductor substrate after polishing.

The rinse polishing treatment can also be performed whichever a one-side polishing device or a double-side polishing device is used. The polishing device preferably has a discharge nozzle for the rinse polishing composition in addition to a discharge nozzle for a polishing composition. The operating conditions in the rinse polishing treatment of the polishing device are not particularly limited and can be set as appropriate by a person skilled in the art.

(II) Cleaning Treatment

The surface treatment composition according to the present invention is suitably used in the cleaning treatment. The cleaning treatment is performed for the purpose of removing the contaminants on the surface of the polishing object after the polishing object has been subjected to final polishing or to the above-described rinse polishing treatment. The cleaning treatment and the above-described rinse polishing treatment are classified according to the place where the treatment is performed. The cleaning treatment is surface treatment performed after removing the polishing object after polishing from the polishing platen. Also in the cleaning treatment, the contaminants on the surface of the polishing object can be removed by bringing the surface treatment composition according to the present invention into direct contact with the polishing object after polishing.

Examples of methods for performing the cleaning treatment include (i) a method including bringing a cleaning brush into contact with one side or both sides of the polishing object after polishing in a state of holding the polishing object after polishing, and then rubbing the surface of a cleaning object with the cleaning brush while supplying the surface treatment composition to a contact region of the cleaning blush and the polishing object after polishing; (ii) a method including immersing the polishing object after polishing in the surface treatment composition, followed by performing ultrasonic treatment or stirring (dip method); and the like. In such methods, the contaminants on the surface of the polishing object are removed by the frictional force by the cleaning brush or the mechanical force generated by the ultrasonic treatment or the stirring and the chemical action by the surface treatment composition.

In the method (i) above, examples of the method for bringing the surface treatment composition (cleaning composition) into contact with the polishing object after polishing include, but are not particularly limited to, a spin method including rotating the polishing object after polishing at a high speed while pouring the surface treatment composition onto the polishing object after polishing from a nozzle, a spray method including cleaning the polishing object after polishing by spraying the surface treatment composition thereto, and the like.

From a point that more efficient contamination removal can be performed in a short time, the spin method or the spray method is preferably adopted as the cleaning treatment and the spin method is more preferable.

Examples of devices for performing such cleaning treatment include a batch cleaning device in which a plurality of polishing objects after polishing placed in a cassette are simultaneously surface-treated, a single-wafer cleaning device in which one polishing object after polishing is attached to a holder and surface-treated, and the like. From the viewpoint of reducing the cleaning time, for example, a method using the single-wafer cleaning device is preferable.

Further, examples of devices for performing the cleaning treatment include a polishing device having a cleaning facility of, after the polishing object after polishing has been removed from the polishing platen, rubbing the polishing object with a cleaning brush. By the use of such a polishing device, the cleaning treatment of the polishing object after polishing can be more efficiently performed.

As such a polishing device, a common polishing device having a holder for holding the polishing object after polishing, a motor capable of changing the number of rotations, a cleaning brush, and the like is usable. As the polishing device, either a one-side polishing device or a double-side polishing device may be used. In a case where the rinse polishing step is performed after the CMP step, it is more efficient and preferable that the cleaning treatment is performed using the same device as the polishing device used in the rinse polishing step.

The cleaning brush is not particularly limited and a resin brush is preferably used. Materials for the resin brush are not particularly limited and PVA (polyvinyl alcohol) is preferably used, for example. As the cleaning brush, a PVA sponge is particularly preferably used.

The cleaning conditions are also not particularly limited and can be set as appropriate according to the type of the cleaning object and the type and the amount of the organic residues to be removed. For example, it is preferable that the number of rotations of the cleaning brush is 10 rpm or more and 200 rpm or less, the number of rotations of the cleaning object is 10 rpm or more and 100 rpm or less, and a pressure (polishing pressure) applied to the cleaning object is 0.5 psi or more and 10 psi or less. A method for supplying the surface treatment composition to the cleaning brush is also not particularly limited and a method including continuously supplying the surface treatment composition using a pump or the like (in the one-way) is adopted, for example. The supply amount is not limited and it is preferable that the surfaces of the cleaning brush and the cleaning object are constantly covered with the surface treatment composition and the supply amount is preferably 10 mL/min or more and 5,000 mL/min or less. The cleaning time is also not particularly limited and is preferably 5 seconds or more and 180 seconds or less in a step of using the surface treatment composition according to one aspect of the present invention. Within such a range, the contaminants can be more effectively removed.

The temperature of the surface treatment composition in the cleaning is not particularly limited and may be usually room temperature (25° C.) and may be increased to about 40° C. or more and 70° C. or less within the range where the performance is not impaired.

In the method (ii) above, the conditions of a cleaning method by immersion are not particularly limited and known techniques can be used.

Before, after, or both before and after performing the cleaning treatment by the method (i) or (ii), water cleaning may be performed.

It is preferable that the polishing object after polishing (cleaning object) after cleaning is dried by removing water droplets adhering to the surface using a spin dryer or the like. The surface of the cleaning object may be dried by air-blow drying.

[Method for Producing Semiconductor Substrate]

The surface treatment method according to one aspect of the present invention can be suitably applied when the polishing object after polishing is a semiconductor substrate after polishing. More specifically, another aspect of the present invention further provides a method for producing a semiconductor substrate in which the polishing object after polishing is a semiconductor substrate after polishing and the semiconductor substrate after polishing is surface-treated using the above-described surface treatment composition.

Details of the semiconductor substrate to which such a production method is applied are as described in the description of the polishing object after polishing to be surface-treated by the above-described surface treatment composition.

The method for producing a semiconductor substrate is not particularly limited insofar as it includes a step of surface-treating the surface of a semiconductor substrate after polishing using the surface treatment composition according to one aspect of the present invention (surface treatment step). Examples of such a production method include, for example, a method including a polishing step of forming a semiconductor substrate after polishing and a cleaning step. Another example of the production method includes a method including, in addition to the polishing step and the cleaning step, a rinse polishing step between the polishing step and the cleaning step. Hereinafter, each of these steps is described.

<Polishing Step>

The polishing step which may be included in the method for producing a semiconductor substrate is a step of polishing a semiconductor substrate to form a semiconductor substrate after polishing.

The polishing step is not particularly limited insofar as it is a step of polishing a semiconductor substrate and is preferably a chemical mechanical polishing (CMP) step. The polishing step may be a polishing step including a single step or may be a polishing step including a plurality of steps. Examples of the polishing step including a plurality of steps include a step of performing a final polishing step after a stock polishing step (rough polishing step), a step of performing one time or two or more times of secondary polishing steps after primary polishing step, and then performing a final polishing step, and the like, for example. The surface treatment step using the surface treatment composition according to the present invention is preferably performed after the above-described final polishing step.

As the polishing composition, known polishing compositions can be used as appropriate according to the properties of the semiconductor substrate. The polishing composition is not particularly limited and those containing abrasives, acid salts, dispersion media, acids, and the like can be preferably used, for example. Specific examples of such a polishing composition include a polishing composition containing ceria, polyacrylic acid, water, and maleic acid and the like.

As the polishing device, a common polishing device to which a holder for holding the polishing object, a motor capable of changing the number of rotations, and the like are attached and which has a polishing platen to which a polishing pad (polishing cloth) can be stuck is usable. As the polishing device, either a one-side polishing device or a double-side polishing device may be used.

As the polishing pad, common nonwoven fabric, polyurethane, porous fluororesin, and the like can be used without being particularly limited. The polishing pad is preferably subjected to grooving such that a polishing liquid is stored.

The polishing conditions are also not particularly limited. For example, the number of rotations of the polishing platen and the number of rotations of a head (carrier) are preferably 10 rpm or more and 100 rpm or less. The pressure applied to the polishing object (polishing pressure) is preferably 0.5 psi or more and 10 psi or less. A method for supplying the polishing composition to the polishing pad is also not particularly limited and a method including continuously supplying the polishing composition using a pump or the like (in the one-way) is adopted, for example. The supply amount is not limited and it is preferable that the surface of the polishing pad is constantly covered with the polishing composition. The supply amount is preferably 10 mL/min or more and 5,000 mL/min or less. The polishing time is also not particularly limited and is preferably 5 seconds or more and 180 seconds or less in a step using the polishing composition.

<Surface Treatment Step>

The surface treatment step refers to a step of reducing the contaminants on the surface of the polishing object after polishing using the surface treatment composition according to the present invention. In the method for producing a semiconductor substrate, the cleaning step as the surface treatment step may be performed after the rinse polishing step or only the rinse polishing step or only the cleaning step may be performed.

(Rinse Polishing Step)

In the method for producing a semiconductor substrate, the rinse polishing step may be included between the polishing step and the cleaning step. The rinse polishing step is a step of reducing the contaminants on the surface of the polishing object after polishing (semiconductor substrate after polishing) by the surface treatment method (rinse polishing treatment method) according to one aspect of the present invention.

With respect to devices, such as the polishing device and the polishing pad, and the polishing conditions, the same devices and conditions as those in the above-described polishing step are applicable except supplying the surface treatment composition according to the present invention in place of supplying the polishing composition.

Details of a rinse polishing method used in the rinse polishing step are as described in the description concerning the rinse polishing treatment.

(Cleaning Step)

In the method for producing a semiconductor substrate, the cleaning step may be included after the polishing step or may be included after the rinse polishing step. The cleaning step is a step of reducing the contaminants on the surface of the polishing object after polishing (semiconductor substrate after polishing) by the surface treatment method (cleaning method) according to one aspect of the present invention.

Details of a cleaning method used in the cleaning step are as described in the description concerning the cleaning method.

EXAMPLES

The present invention is described in more detail with reference to Examples and Comparative Examples described below. However, the technical scope of the present invention is not limited only to Examples described below. Unless otherwise specified, "%" and "part(s)" mean "mass %" and "mass part(s)", respectively. Moreover, in Examples described below, unless otherwise specified, operations were performed under the conditions of room temperature (25° C.)/Relative humidity RH of 40 to 50%.

As the weight average molecular weight of each high molecular weight compound, a value of the weight average molecular weight (in terms of polyethylene glycol) measured by gel permeation chromatography (GPC) was used. More specifically, the weight average molecular weight was measured using the following devices under the following conditions.

GPC device: manufactured by Shimadzu Corporation
Model type: Prominence+ELSD detector (ELSD-LTII)
Column: VP-ODS (manufactured by Shimadzu Corporation)
Mobile phase A: MeOH
B: 1% Aqueous acetic acid solution
Flow rate: 1 mL/min
Detector: ELSD temp. 40° C., Gain 8, N2GAS 350 kPa
Oven temperature: 40° C.
Injection amount: 40 μL

Preparation of Surface Treatment Composition

Example 1: Preparation of Surface Treatment Composition (A-1)

0.1 mass part of poly-N-vinylacetamide (Weight average molecular weight (Mw): 300,000; Constituent unit represented by Formula (1): 100 mol %) and 0.01 mass part of a polystyrene sulfonate-acrylic acid copolymer (Weight average molecular weight (Mw): 10,000) as the ionic dispersant were individually mixed with water (deionized water) when the total amount of a composition was 100 mass parts, and then nitric acid as a pH adjuster was added in an amount that sets the pH to 2.5 to prepare a surface treatment composition (A-1). The pH of the surface treatment composition (A-1) (Liquid temperature: 25° C.) was measured with a pH meter (Manufactured by HORIBA, LTD., Product Name: LAQUA (Registered Trademark)).

Examples 2 to 22 and Comparative Examples 1 to 7: Preparation of Surface Treatment Compositions (A-2) to (A-22) and (a-1) to (a-7)

Surface treatment compositions were prepared by the same operation as in Example 1 except using components of types, molecular weights, and contents illustrated in Table 1 and adjusting the pH of each surface treatment composition to a pH illustrated in Table 1 (using ammonia water when making the surface treatment composition neutral or alkaline). In Table 1, "-" indicates that the component was not used. In Table 1, "vinyl polymer" refers to one obtained by homopolymerizing or copolymerizing a vinyl monomer.

In Table 1, PSS-PA indicates "polystyrene sulfonate-acrylic acid copolymer".

<Evaluation>

<Preparation of Polishing Object after Polishing (Surface Treatment Object)>

A silicon nitride substrate after polishing, a TEOS substrate after polishing, and a polysilicon substrate after polishing which were polished by a chemical mechanical polishing (CMP) step described later or a silicon nitride substrate after polishing, a TEOS substrate after polishing, and a polysilicon substrate after polishing which were further treated by a rinse step described later as necessary were prepared as surface treatment objects.

[CMP Step]

The silicon nitride substrate, the TEOS substrate, and the polysilicon substrate which are semiconductor substrates were polished using 1 mass % of a polishing composition M (Composition; ceria, Primary particle diameter of 60 nm, Secondary particle diameter of 100 nm), 0.18 mass % of a maleic acid aqueous solution having a concentration of 30 mass %, 0.25 mass % of polyacrylic acid (Molecular weight: 6,000), and water as a solvent under the following conditions. Herein, 300 mm wafers were used for the silicon nitride substrate, the TEOS substrate, and the polysilicon substrate.

(Polishing Device and Polishing Conditions)

- Polishing device: FREX 300E manufactured by Ebara Corporation
- Polishing pad: Soft pad H800 manufactured by FUJIBO HOLDINGS, INC.
- Polishing pressure: 2.0 psi (1 psi=6894.76 Pa, which similarly applies to the following description)
- Number of rotations of polishing platen: 90 rpm
- Number of rotations of head: 90 rpm
- Supply of polishing composition: One-way
- Supply amount of polishing composition: 200 mL/min.
- Polishing time: For 60 seconds

[Rinse Polishing Treatment Step]

With respect to the silicon nitride substrate after polishing, the TEOS substrate after polishing, and the polysilicon substrate after polishing which were polished by the CMP step, each substrate after polishing was removed from the polishing platen. Subsequently, each substrate after polishing was attached onto another polishing platen, and then rinse polishing treatment was performed to each substrate surface using each of the surface treatment compositions prepared above under the following conditions within the same polishing device.

(Polishing Device and Polishing Conditions)

- Polishing device: FREX 300E manufactured by Ebara Corporation
- Polishing pad: Soft pad H800 manufactured by FUJIBO HOLDINGS, INC.
- Polishing pressure: 1.0 psi (1 psi=6894.76 Pa, which similarly applies to the following description)
- Number of rotations of polishing platen: 60 rpm
- Number of rotations of head: 60 rpm
- Supply of polishing composition: One-way
- Supply amount of polishing composition: 300 mL/min.
- Polishing time: For 60 seconds (Water Cleaning Step)

Each substrate after the rinse polishing treatment obtained above was cleaned for 60 seconds while pouring deionized water (DIW) using a PVA brush after the rinse polishing in a cleaning unit. Thereafter, each substrate was dried with a spin dryer for 30 seconds.

<Evaluation>

Each substrate after the water cleaning step obtained above was measured and evaluated for the following items. The evaluation results are illustrated in Table 2.

[Measurement of Total Number of Defects]

The number of defects of each of the silicon nitride substrate (0.038 μm or more), the TEOS substrate (0.037 μm or more), and the polysilicon substrate (0.057 μm or more) after the surface treatment after the water cleaning step obtained above was measured. For the measurement of the number of defects, a wafer defect tester SP-5 manufactured by KLA TENCOR was used. The measurement was performed for a remaining portion excluding a 3 mm wide portion (portion with a width from 0 mm to 3 mm when an outer peripheral end portion was set to 0 mm) from the outer peripheral end portion of each substrate surface after the surface treatment.

[Evaluation of Number of Organic Residues]

The polishing objects after polishing after subjected to the surface treatment were measured for the number of organic residues using a Review SEM RS6000 manufactured by Hitachi, Ltd. by SEM observation. First, 100 defects present on the remaining portion excluding the 3 mm wide portion from the outer peripheral end portion of one side of the polishing object after polishing were sampled by SEM observation. Subsequently, the organic residues were visually distinguished by SEM observation out of the sampled 100 defects, and then the number of the organic residues was confirmed, whereby the ratio (%) of the organic residues in the defects was calculated. Then, the product of the total number (pieces) of defects of the silicon nitride substrate (0.038 μm or more), the TEOS substrate (0.037 μm or more), and the polysilicon substrate (0.057 μm or more) measured using the SP-5 manufactured by KLA TENCOR in the evaluation of the total number of defects described above and the ratio (%) of the organic residues in the defects calculated from the above-described SEM observation result was calculated as the number (pieces) of the organic residues.

The ratio (%) of the organic residues in the defects was set to 10% in the silicon nitride (SiN) substrate, 10% in the TEOS substrate, and 90% in the polysilicon substrate. As the criteria for determining that the number of the organic residues was reduced, cases where the number of the organic residues was 1,500 or less in the TEOS substrate and the number of the organic residues was 5,000 or less in the polysilicon substrate were determined to be good.

With respect to each surface treatment composition, the evaluation results of the organic residues when using the silicon nitride substrate after polishing, when using the TEOS substrate after polishing, and when using the polysilicon substrate after polishing as the surface treatment object are illustrated in Table 2 below.

TABLE 1

| | Vinyl polymer | | | Ionic dispersant | | | Glycerol-based water-soluble polymer | | | |
|---|---|---|---|---|---|---|---|---|---|---|
| | Type | Mw | Content (wt %) | Type | Mw | Content (wt %) | Type | Mw | Content (wt %) | pH |
| Ex. 1 (A-1) | Poly-N-vinylacetamide | 300,000 | 0.1 | PSS-PA | 10,000 | 0.01 | — | — | — | 2.5 |
| Ex. 2 (A-2) | Poly-N-vinylacetamide | 300,000 | 0.1 | — | — | — | — | — | — | 2.5 |
| Ex. 3 (A-3) | Poly-N-vinylacetamide | 300,000 | 0.1 | PSS-PA | 10,000 | 0.01 | Polyglycerol | 15,000 | 0.1 | 2.5 |
| Ex. 4 (A-4) | Poly-N-vinylacetamide | 50,000 | 0.075 | PSS-PA | 10,000 | 0.01 | — | — | — | 2.5 |
| Ex. 5 (A-5) | Poly-N-vinylacetamide | 50,000 | 0.1 | PSS-PA | 10,000 | 0.01 | — | — | — | 2.5 |

TABLE 1-continued

| | Vinyl polymer | | | Ionic dispersant | | | Glycerol-based water-soluble polymer | | | |
|---|---|---|---|---|---|---|---|---|---|---|
| | Type | Mw | Content (wt %) | Type | Mw | Content (wt %) | Type | Mw | Content (wt %) | pH |
| Ex. 6 (A-6) | Poly-N-vinylacetamide | 50,000 | 0.2 | PSS-PA | 10,000 | 0.01 | — | — | — | 2.5 |
| Ex. 7 (A-7) | Poly-N-vinylacetamide | 50,000 | 0.3 | PSS-PA | 10,000 | 0.01 | — | — | — | 2.5 |
| Ex. 8 (A-8) | Poly-N-vinylacetamide | 100,000 | 0.1 | PSS-PA | 10,000 | 0.01 | — | — | — | 2.5 |
| Ex. 9 (A-9) | Poly-N-vinylacetamide | 900,000 | 0.1 | PSS-PA | 10,000 | 0.01 | — | — | — | 2.5 |
| Ex. 10 (A-10) | Poly-N-vinylacetamide | 50,000 | 0.1 | PSS-PA | 10,000 | 0.01 | — | — | — | 2.0 |
| Ex. 11 (A-11) | Poly-N-vinylacetamide | 50,000 | 0.1 | PSS-PA | 10,000 | 0.01 | — | — | — | 3.0 |
| Ex. 12 (A-12) | Poly-N-vinylacetamide | 50,000 | 0.1 | PSS-PA | 10,000 | 0.01 | — | — | — | 4.0 |
| Ex. 13 (A-13) | Poly-N-vinylacetamide | 50,000 | 0.1 | PSS-PA | 10,000 | 0.01 | — | — | — | 5.0 |
| Ex. 14 (A-14) | Poly-N-vinylacetamide | 50,000 | 0.1 | PSS-PA | 10,000 | 0.01 | — | — | — | 6.0 |
| Ex. 15 (A-15) | Poly-N-vinylacetamide | 50,000 | 0.1 | PSS-PA | 10,000 | 0.01 | — | — | — | 7.0 |
| Ex. 16 (A-16) | Poly-N-vinylacetamide | 50,000 | 0.1 | PSS-PA | 10,000 | 0.01 | — | — | — | 8.0 |
| Ex. 17 (A-17) | Poly-N-vinylacetamide | 50,000 | 0.1 | PSS-PA | 10,000 | 0.01 | — | — | — | 9.0 |
| Ex. 18 (A-18) | Poly-N-vinylacetamide | 50,000 | 0.1 | PSS-PA | 10,000 | 0.01 | — | — | — | 10.0 |
| Ex. 19 (A-19) | Poly-N-vinylacetamide | 300,000 | 0.1 | PSS-PA | 10,000 | 0.01 | — | — | — | 4.0 |
| Ex. 20 (A-20) | Poly-N-vinylacetamide | 300,000 | 0.1 | PSS-PA | 10,000 | 0.01 | — | — | — | 6.0 |
| Ex. 21 (A-21) | Poly-N-vinylacetamide | 300,000 | 0.1 | PSS-PA | 10,000 | 0.01 | — | — | — | 8.0 |
| Ex. 22 (A-22) | Poly-N-vinylacetamide | 300,000 | 0.1 | PSS-PA | 10,000 | 0.01 | — | — | — | 12.0 |
| Comp. Ex. 1 (a-1) | PVA | 10,000 | 0.1 | — | — | — | — | — | — | 2.5 |
| Comp. Ex. 2 (a-2) | PVA | 10,000 | 0.1 | PSS-PA | 10,000 | 0.01 | — | — | — | 2.5 |
| Comp. Ex. 3 (a-3) | PVA | 10,000 | 0.1 | — | — | — | Polyglycerol | 15,000 | 0.1 | 2.5 |
| Comp. Ex. 4 (a-4) | PVA | 10,000 | 0.1 | PSS-PA | 10,000 | 0.01 | Polyglycerol | 15,000 | 0.1 | 2.5 |
| Comp. Ex. 5 (a-5) | PVA | 5,000 | 0.1 | — | — | — | — | — | — | 2.5 |
| Comp. Ex. 6 (a-6) | PVA | 80,000 | 0.1 | — | — | — | — | — | — | 2.5 |
| Comp. Ex. 7 (a-7) | PVA | 100,000 | 0.1 | — | — | — | — | — | — | 2.5 |

TABLE 2

| | Total number of defects (pieces) | | | Organic residues (pieces) SP-5 | | |
|---|---|---|---|---|---|---|
| | SP-5 | | | Total number | Total number | Total number |
| | SiN ≥0.038 μm | TEOS ≥0.037 μm | PolySi ≥0.057 μm | of defects 10% | of defects 10% | of defects 90% |
| Ex. 1 (A-1) | 1,312 | 11,782 | 1,849 | 131 | 1,178 | 1,664 |
| Ex. 2 (A-2) | 250,000 | 10,755 | 1,988 | 25,000 | 1,076 | 1,789 |
| Ex. 3 (A-3) | 2,019 | 10,660 | 1,051 | 202 | 1,066 | 946 |
| Ex. 4 (A-4) | 2,629 | 7,343 | 3,645 | 263 | 734 | 3,281 |
| Ex. 5 (A-5) | 2,022 | 8,198 | 3,959 | 202 | 820 | 3,563 |
| Ex. 6 (A-6) | 3,004 | 8,052 | 2,889 | 300 | 805 | 2,600 |
| Ex. 7 (A-7) | 2,894 | 7,419 | 3,409 | 289 | 742 | 3068 |
| Ex. 8 (A-8) | 2,611 | 11,943 | 1,662 | 261 | 1,194 | 1,496 |
| Ex. 9 (A-9) | 2,832 | 14,501 | 1,376 | 283 | 1,450 | 1,238 |
| Ex. 10 (A-10) | 1,988 | 7,486 | 3,299 | 199 | 749 | 2,969 |
| Ex. 11 (A-11) | 2,114 | 6,697 | 2,901 | 211 | 670 | 2,611 |
| Ex. 12 (A-12) | 5,677 | 7,534 | 2,379 | 568 | 753 | 2,141 |
| Ex. 13 (A-13) | 250,000 | 7,679 | 2,476 | 25,000 | 768 | 2,228 |
| Ex. 14 (A-14) | 250,000 | 8,639 | 2,873 | 25,000 | 864 | 2,586 |
| Ex. 15 (A-15) | 250,000 | 8,491 | 2,697 | 25,000 | 849 | 2,427 |
| Ex. 16 (A-16) | 250,000 | 8,994 | 2,569 | 25,000 | 899 | 2,312 |
| Ex. 17 (A-17) | 250,000 | 8,120 | 2,863 | 25,000 | 812 | 2,577 |
| Ex. 18 (A-18) | 250,000 | 6,329 | 1,994 | 25,000 | 633 | 1,795 |
| Ex. 19 (A-19) | 4,492 | 12,085 | 1,553 | 449 | 1,209 | 1,398 |
| Ex. 20 (A-20) | 250,000 | 14,435 | 1,962 | 25,000 | 1,444 | 1,766 |
| Ex. 21 (A-21) | 250,000 | 10,983 | 1,093 | 25,000 | 1,098 | 984 |
| Ex. 22 (A-22) | 250,000 | 11,689 | 832 | 25,000 | 1,169 | 749 |
| Comp. Ex. 1 (a-1) | 250,000 | 28,264 | 13,540 | 25,000 | 2,826 | 12,186 |
| Comp. Ex. 2 (a-2) | 2,245 | 27,318 | 11,755 | 225 | 2,732 | 10,580 |
| Comp. Ex. 3 (a-3) | 250,000 | 28,632 | 10,413 | 25,000 | 2,863 | 9,372 |
| Comp. Ex. 4 (a-4) | 3,066 | 26,542 | 9,978 | 307 | 2,654 | 8,980 |
| Comp. Ex. 5 (a-5) | 250,000 | 23,301 | 15,022 | 25,000 | 2,330 | 13,520 |
| Comp. Ex. 6 (a-6) | 250,000 | 26,499 | 11,245 | 25,000 | 2,650 | 10,121 |
| Comp. Ex. 7 (a-7) | 250,000 | 30,020 | 10,771 | 25,000 | 3,002 | 9,694 |

As is clear from Table 1 and Table 2 above, it was found that the surface treatment compositions of Examples can reduce the organic residues on the surfaces of the polishing objects after polishing compared to the surface treatment compositions of Comparative Examples.

Specifically, it was found that the surface treatment compositions of Examples 1 to 22 containing poly-N-vinylacetamide can reduce the organic residues on the surface of the TEOS substrate after polishing compared to the surface treatment compositions of Comparative Examples 1 to 7.

Further, it was found that the surface treatment compositions of Examples 1 to 22 in which the weight average molecular weight (Mw) of poly-N-vinylacetamide is 50,000 or more and 900,000 or less can reduce both the organic residues on the surface of the TEOS substrate after polishing and the organic residues on the surface of the polysilicon substrate after polishing compared to Comparative Examples 1 to 7.

Further, it was found that the surface treatment compositions of Examples 1 to 11 containing at least one of the glycerol-based water-soluble polymer and the ionic polymer and having a pH of 3.0 or less can reduce both the organic residues on the surface of the TEOS substrate after polishing and the organic residues on the surface of the silicon nitride substrate after polishing compared to Comparative Examples 1 to 7.

What is claimed is:

1. A surface treatment composition comprising:

a polymer having a constituent unit represented by Formula (1) below;

water; and a water-soluble polymer having a constituent unit derived from glycerol, wherein a content of the water-soluble polymer is 0.03 mass % or more and 0.5 mass % or less based on a total amount of the surface treatment composition, the surface treatment composition being used for treating a surface of a polishing object after polishing, (1)

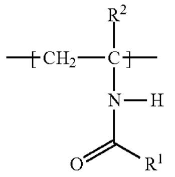

wherein, in Formula (1) above, $R^1$ is a hydrocarbon group having 1 to 5 carbon atoms and $R^2$ is a hydrogen atom or a hydrocarbon group having 1 to 3 carbon atoms; and wherein the surface treatment composition is substantially free from an abrasive.

2. The surface treatment composition according to claim 1, wherein a pH is 5 or less.

3. The surface treatment composition according to claim 2, wherein a pH is 3 or less.

4. The surface treatment composition according to claim 2 further comprising:

an ionic dispersant.

5. The surface treatment composition according to claim 1, wherein a pH is 3 or less.

6. The surface treatment composition according to claim 5 further comprising:

an ionic dispersant.

7. The surface treatment composition according to claim 1 further comprising: an ionic dispersant.

8. The surface treatment composition according to claim 7, wherein the ionic dispersant is a high molecular weight compound having a sulfonic acid (salt) group.

9. The surface treatment composition according to claim 1, wherein the polishing object after polishing contains polysilicon.

10. The surface treatment composition according to claim 1, wherein a weight average molecular weight of the polymer is 50,000 or more and 900,000 or less.

11. The surface treatment composition according to claim 10 further comprising:

an ionic dispersant.

12. A method for producing a surface treatment composition, the method comprising:

mixing a polymer having a constituent unit represented by Formula (1) below, water, and a water-soluble polymer having a constituent unit derived from glycerol, wherein a content of the water-soluble polymer is 0.03 mass % or more and 0.5 mass % or less based on a total amount of the surface treatment composition, (1)

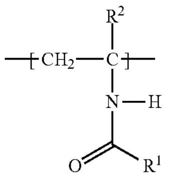

wherein, in Formula (1), $R^1$ is a hydrocarbon group having 1 to 5 carbon atoms and $R^2$ is a hydrogen atom or a hydrocarbon group having 1 to 3 carbon atoms; and wherein the surface treatment composition is substantially free from an abrasive.

13. A surface treatment method comprising:

surface-treating a polishing object after polishing using the surface treatment composition according claim 1 to reduce an organic residue on a surface of the polishing object after polishing.

14. The surface treatment method according to claim 13, wherein the surface treatment includes rinse polishing or cleaning.

15. A method for producing a semiconductor substrate comprising:

a surface treatment step of reducing an organic residue on a surface of a polishing object after polishing by the surface treatment method according to claim 10, wherein the polishing object after polishing is a semiconductor substrate after polishing.

* * * * *